United States Patent [19]
Zhou et al.

[11] Patent Number: 5,876,614
[45] Date of Patent: Mar. 2, 1999

[54] METHOD OF WET ETCHING ALUMINUM OXIDE TO MINIMIZE UNDERCUTTING

[75] Inventors: Bo Zhou, Boulder, Colo.; Barry Allen McPherron, Gilbert, Ariz.; Subrata Dey, Fremont, Calif.; Yi-Shung Chaug, Boulder, Colo.

[73] Assignee: Storage Technology Corporation, Louisville, Colo.

[21] Appl. No.: 844,437

[22] Filed: Apr. 18, 1997

[51] Int. Cl.$^6$ .................................................. H01L 21/44
[52] U.S. Cl. ............................ 216/41; 216/49; 216/51; 216/102; 216/101; 216/17; 216/751; 216/754; 216/778; 216/700; 216/764
[58] Field of Search .................................. 216/41, 49, 51, 216/101, 102, 17, 751, 754, 778, 700, 104

[56] References Cited

U.S. PATENT DOCUMENTS

| | | | |
|---|---|---|---|
| 4,556,628 | 12/1985 | Greschner et al. | 430/314 |
| 5,286,343 | 2/1994 | Hui | 156/647 |
| 5,385,634 | 1/1995 | Butler et al. | 156/644 |
| 5,413,953 | 5/1995 | Chien et al. | 437/69 |
| 5,449,635 | 9/1995 | Jun | 437/52 |
| 5,470,793 | 11/1995 | Kalnitsky | 437/195 |
| 5,635,423 | 6/1997 | Huang et al. | 437/195 |

*Primary Examiner*—Robert Kunemund
*Attorney, Agent, or Firm*—Duft, Graziano & Forest

[57] ABSTRACT

The method of wet etching an aluminum oxide substrate deposits a thin layer of titanium film or chromium film on the aluminum oxide surface prior to the application of the photo-resist coating to form a barrier between the aluminum oxide and the photo-resist. This barrier layer inhibits the reaction between the aluminum oxide and the photo-resist during the photolithographic process. The undercutting of the aluminum oxide in the wet etching process is therefore controlled by the deposition of the barrier layer comprising the thin layer of titanium film or chromium film. The titanium film used is nominally 30 Å thick to obtain the beneficial effects noted above while the chromium film would be approximately 1000 Å thick.

9 Claims, 2 Drawing Sheets

METHOD OF WET ETCHING ALUMINUM OXIDE TO MINIMIZE UNDERCUTTING

FIELD OF THE INVENTION

This invention relates to the fabrication of thin film devices using a wet etching process on aluminum oxide and, in particular, the use of a barrier layer deposited on the aluminum oxide layer in this process to thereby precisely regulate the etching process and prevent undercutting in the formation of cavities into the aluminum oxide layer.

PROBLEM

It is a problem in the field of manufacturing thin film devices to precisely regulate the etching of aluminum oxide to thereby implement the structures that are desired. In the thin film device manufacturing process, a substrate is used as the foundation for the formation of the desired devices. An oxide layer is deposited on the substrate surface by sputtering, and the thickness of this oxide layer varies widely, from a few thousand Angstroms (Å) thick to several microns thick, depending on the specific application. Aluminum oxide film is generally used and functions as an insulating layer in the fabrication of microelectronic devices, thin film recording devices and micro-electromechanical devices. The widespread use of aluminum oxide in this process has resulted in a significant amount of sophisticated technology to precisely create the structures that are required to implement the various devices of interest.

The pattern and geometric shape of the aluminum oxide used to fabricate a device are generally regulated by using photolithographic techniques, which consist of the steps of: depositing a layer of photo-resist on the aluminum oxide surface, exposing the photo-resist to light with certain wave length light through a mask having a predetermined pattern cut therein, developing the photo-resist, removing the exposed photo-resist, etching the aluminum oxide that is exposed through the photo-resist and then finally removing the remaining photo-resist. This process may be repeated a number of times to implement complex devices.

There presently is no appropriate dry etching process that can be used for the processing of aluminum oxide, so the above noted procedures are implemented by means of wet etching the aluminum oxide in an acid or base environment. A problem with this wet etching technique is that the aluminum oxide can easily be undercut, wherein the aluminum oxide is over-etched in line widths and the angles of walls that are formed when cavities or holes are etched into the aluminum oxide. Studies reveal that the undercut problem in the aluminum oxide is exacerbated by the formation of an interfacial layer comprising a substance which has a higher wet etch rate than the aluminum oxide and this substance is typically located at the interface between the photo-resist and the aluminum oxide surface during the photolithographic process. In particular, during the soft bake (90° C. to 120° C.) of the photo-resist in the photolithographic process, the reaction between the aluminum oxide insulating layer and the solvent released from the photo-resist forms a substance of hydrated-like aluminum oxide at the interface of the aluminum oxide and photo-resist. The wet etch rate of the hydrated-like aluminum oxide in etchant is much higher than that of aluminum oxide. This aluminum oxide undercut problem becomes more pronounced in devices which have high density patterning and in devices which have aluminum oxide features having high aspect ratios, wherein the depth of the cavities or holes is significantly greater than the width. In a worst case scenario, severe undercut deteriorates the functionality of the aluminum oxide in the resultant device. Therefore, controlling the extent of undercutting in a wet etching process of aluminum oxide is a critical issue in the fabrication of high density devices.

There are a number of processes which have been used in an attempt to address the problem of regulating the speed and extent of etching of aluminum oxide. In particular, U.S. Pat. No. 5,470,793 discloses a method for depositing a silicon nitride layer on the aluminum oxide surface during the photoresist process to protect and isolate the underlying dielectric layers during the wet etching. The silicon nitride layer maintains the integrity of interconnect leads, bond pads and die boundaries which it covers by acting as an etch stop. This process essentially uses the silicon nitride as an etch stop layer to prevent the chemicals used in the etching process from reacting with the aluminum oxide substrate or other layers of the integrated circuit, but does not address the issue of undercutting in cavities or holes.

U.S. Pat. No. 5,449,635 discloses a method for fabricating a semiconductor memory wherein transistors and contact holes are formed on the substrate in a conventional manner and an insulating layer is then formed over the transistors. A first conductive layer, an etch preventing layer and a first temporary film are successively deposited on the device, including in the contact holes. The first temporary film and etch preventing film are then selectively removed to expose the first conductive layer. A second temporary layer is then deposited on the first temporary film and exposed areas of the first conductive layer. The second temporary film is then etched to form sidewall spacers in the contact holes. Additional conductor deposition is then used to coat the bottom and sidewalls of the contact holes to form capacitors on the device. The second temporary film is used as an etch preventing film for the contact hole sidewalls, but only after the contact holes are formed in their entirety.

U.S. Pat. No. 5,413,953 discloses a method for planarization of the silicon oxide layers on semiconductor substrates. This process is a wet etching process that uses diluted hydrogen fluoride to etch the silicon oxide film, thereby reducing the amount of reactivity.

U.S. Pat. No. 5,385,634 discloses a method for fabricating a contact window on a substrate to interconnect a source/drain electrode with the adjacent gate electrode of an integrated circuit device. This process makes use of a protective barrier applied to the silicon oxide, which protective barrier comprises silicon nitride and titanium nitride to prevent the wet etching process from reacting with the silicon oxide.

U.S. Pat. No. 5,286,343 discloses a method for protecting the corners of a mask that prevents the chip corners from undercutting during the anisotropic etching of the wafer. The corner protective masks abut the chip corner point and extend laterally from segments along one or both corner sides of the corner point, forming lateral extensions.

All these above noted attempts to minimize the reaction of the chemicals used in the wet etch process with the aluminum oxide substrate function as a mask or a process retardant to thereby prevent the wet etch process from attacking the aluminum oxide or to extend the time required for the wet etch process to perform the aluminum oxide removal. None of the above noted methods acknowledge or address the issue of localized areas of high reactivity where the aluminum oxide layer meets the mask layer. Therefore, the basic undercut problem where over-etching occurs due to the higher reactivity of the aluminum oxide with the mask, is present in all of the wet etching processes described above.

SOLUTION

The above described problems are solved and a technical advance achieved in the field by the method of wet etching aluminum oxide of the present invention, wherein metal mask comprising a thin layer of titanium film or chromium film is deposited on the aluminum oxide surface prior to the application of the photo-resist coating to form a barrier between the aluminum oxide and the photo-resist. This barrier layer inhibits the reaction between the aluminum oxide and the solvents released from the photo-resist during the photolithographic process. This inhibits the production of the hydrated-like aluminum oxide, thereby removing the region of increased reactivity from the aluminum oxide insulating layer. The undercutting of the aluminum oxide in the wet etching process is therefore controlled by the deposition of the barrier layer comprising the thin layer of titanium film or chromium film.

The titanium film used is approximately 30 Å thick while the chromium film is approximately 1000 Å thick to obtain the beneficial effects noted above. When the thickness of the deposited titanium film is more than 50 Å, the aluminum oxide surface becomes conducting and the aluminum oxide surface is therefore not etchable in either an acid or a base solution in the wet etch process. Some additional process steps are therefore needed in the case where the titanium film is of this thickness or if the chromium film is used. These additional steps include removing the titanium film from the window area that is exposed during the photolithographic processing via ion milling prior to the wet etching technique. Alternatively, the barrier layer can be removed after the photo-resist stripping. The etch rate and insulating property of the aluminum oxide surface are not affected by the use of a barrier layer, therefore, the aluminum oxide undercut in the wet etching process is controllable by adding a one-step process comprising the deposition of a very thin layer of titanium film or chromium film on the aluminum oxide surface prior to the photo-resist coating.

DETAILED DESCRIPTION

Figure 4:
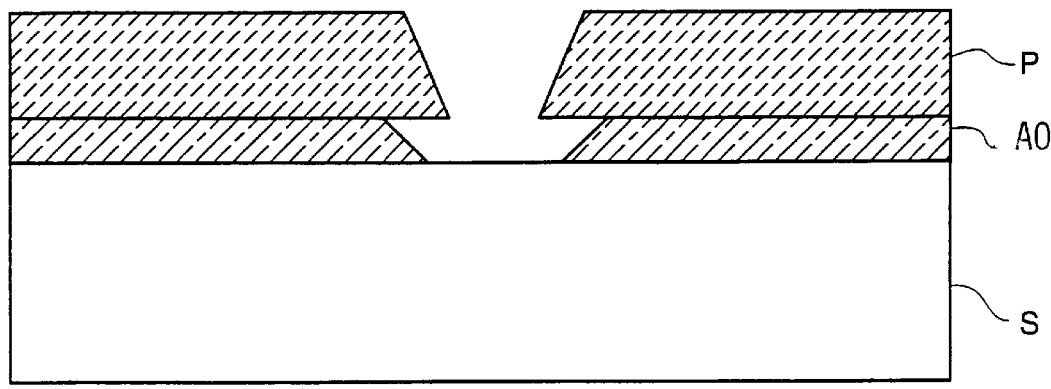
FIG. 4 illustrates in cross-sectional representation the production of contact holes using the processes of the prior art.

In the thin film device manufacturing process, a substrate S as shown in FIG. 4, is used as the foundation for the formation of the desired devices. An oxide layer is deposited on the substrate surface by sputtering, and the thickness of this oxide layer varies widely, from a few thousand Å thick to several microns thick, depending on the specific application. Aluminum oxide is generally used and functions as an insulating layer AO in the fabrication of microelectronic devices, thin film recording devices and micro-electromechanical devices. The pattern and geometric shape of the insulating layer AO used to fabricate a device are generally regulated by using photolithographic techniques, which consist of the steps of: depositing a layer of photo-resist P on the surface of the insulating layer AO, exposing the photo-resist P to ultraviolet light through a mask having a predetermined pattern cut therein, developing the photo-resist P, removing the exposed photo-resist, wet etching the insulating layer AO that is exposed through the photo-resist P in an acid or base environment, and then finally removing the remaining photo-resist P. This process may be repeated a number of times to implement complex devices.

The insulating layer AO can easily be undercut in this process, as shown in FIG. 4, wherein the insulating layer AO is over-etched in line widths and the angles of walls that are formed when cavities or holes are etched into the insulating layer AO. The undercut problem in the aluminum oxide implementation of the insulating layer AO is exacerbated by the formation of a substance which has a higher wet etch rate than the aluminum oxide and this substance is typically located at the interface between the photo-resist P and the aluminum oxide surface during the photolithographic process. In particular, during the soft bake (90° C. to 120° C.) of the photo-resist in the photolithographic process, the reaction between the aluminum oxide insulating layer and the solvent released from the photo-resist forms a substance of hydrated-like aluminum oxide at the interface of the aluminum oxide and photo-resist. The wet etch rate of the hydrated-like aluminum oxide in etchant is much higher than that of aluminum oxide. This aluminum oxide undercut problem becomes more pronounced in devices which have high density patterning and in devices which have aluminum oxide features having high aspect ratios, wherein the depth of the cavities or holes is significantly greater than the width.

In the manufacture of magnetic tape read/write heads, the present technology implements a 36-track head. The insulating space of aluminum oxide that is provided within the write coil of the read/write head is designed as 20 microns. By using the present state-of-the-art wet etching process described above, wherein the aluminum oxide is photolithographically processed, the undercut of aluminum oxide results in an insulating space as low as 9 microns with a shallow wall angle of 24°. The resulting geometry and dimensions result in a product wherein the thickness of the aluminum oxide is at the lowest range of allowability for the insulating application. Some side effects due to undercutting of the aluminum oxide results in a high failure rate in the manufacture of these read/write head.

Wet Etching of Aluminum Oxide Using a Protective Barrier Layer

The wet etching method of the present invention controllably regulates the wet etching process in a manner to insulate the insulating layer from undercutting by the deposition of a protective barrier layer comprising a titanium film or a chromium film. The manufacturing process is implemented as a single step in the standard photolithographic process used to etch the aluminum oxide substrate.

Figure 1:
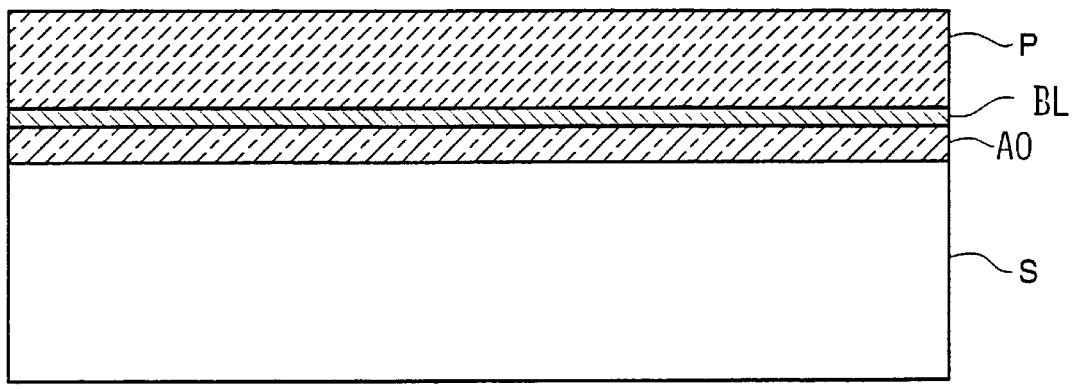
FIGS. 1–2 illustrate in cross-sectional representation, the method of wet etching an aluminum oxide substrate of the present invention.
Figure 2:
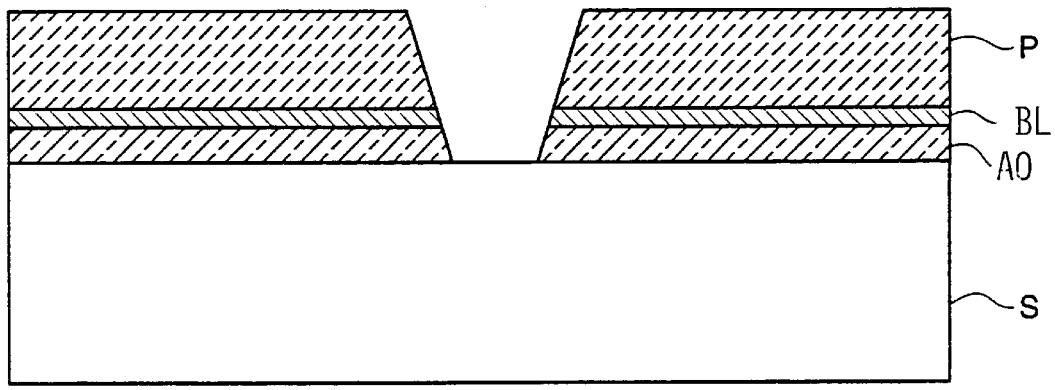
Figure 3:
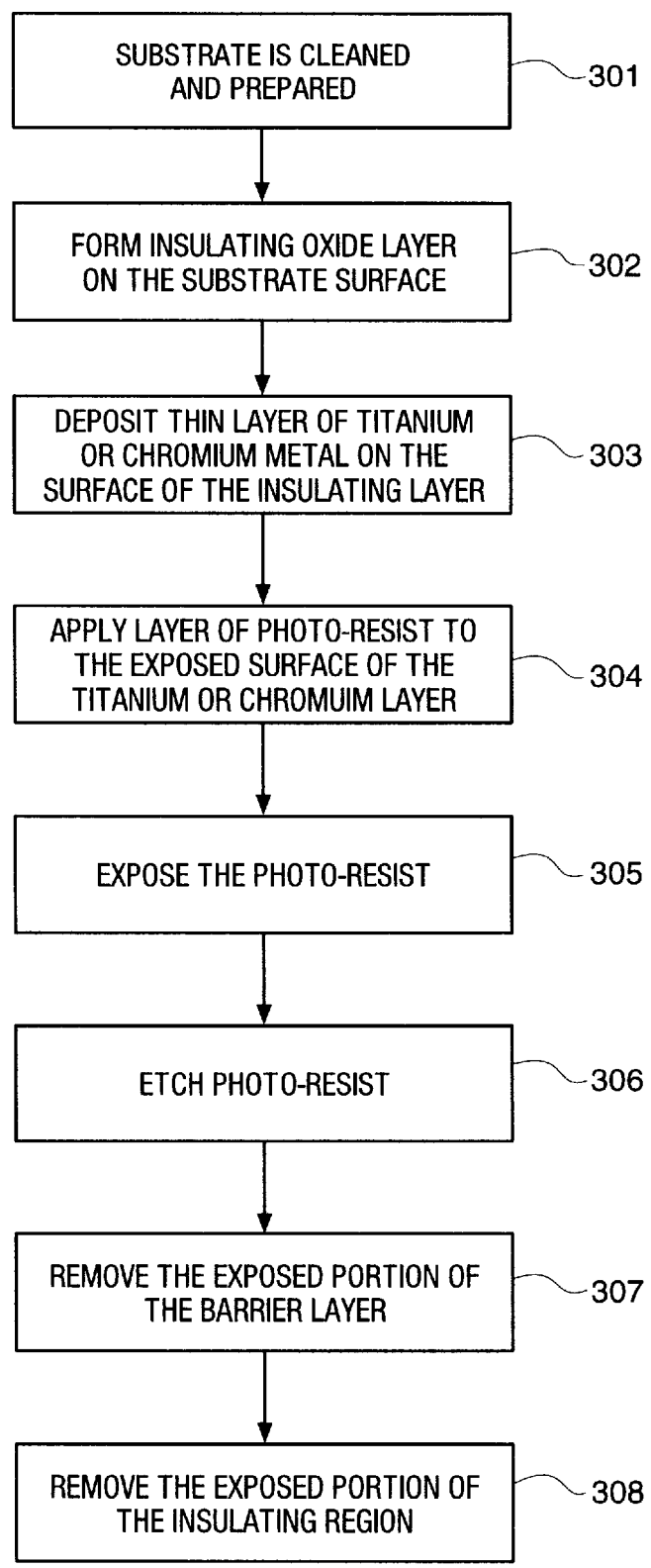
FIG. 3 illustrates in flow diagram form the method of wet etching an aluminum oxide substrate of the present invention.

FIGS. 1–2 illustrate in cross-sectional representation, the substrate processing method of the present invention, which method is shown in flow diagram form in FIG. 3. In particular, a substrate S is shown as the underlying structure on which the devices of interest are formed. The substrate S is cleaned and prepared in step 301 as in traditional wet etch processing. An oxide layer AO is deposited on the substrate surface by sputtering at step 302, and the thickness of this oxide layer varies widely, from a few thousand Å thick to several microns thick, depending on the specific application. Aluminum oxide film is generally used as this insulating layer AO in the fabrication of microelectronic devices, thin film recording devices and micro-electromechanical devices. At step 303, a thin layer of titanium or chromium metal BL is deposited, by sputtering or evaporation, on the surface of the insulating layer AO to thereby completely cover the insulating layer AO. The thickness of the titanium layer BL deposited on the insulating layer AO is preferably 30 Å but can be any thickness within the range of 20 Å to 40 Å. The thickness of the chromium layer is approximately 1000 Å. The selection of the titanium layer thickness is a function of design choice wherein the titanium layer BL must be of sufficient thickness to have some efficacy in retarding the undercutting of the aluminum oxide used to form the insulating layer AO, yet be thin enough that is does not provide an etching block as is noted below. For the purpose of this description, a nominal thickness of 30 Å is noted, but is merely one embodiment of this process for simplicity of description.

Once the barrier layer BL is deposited, by sputtering or evaporation, on the insulating layer AO, a layer of photo-resist P is applied to the exposed surface of the barrier layer BL at step 304. A mask (not shown) is then used at step 305 to expose the photo-resist in the traditional photolithographic processing of the device and the exposed areas of the photo-resist P are subsequently etched at step 306 by the wet etch process. At step 307, the exposed section of the barrier layer BL is etched by the wet etch process in the case of a thin titanium layer or by ion milling in the case of a thin chromium layer. Once the exposed portion of the barrier layer is removed at step 308 the underlying regions of the insulating layer AO, which are delimited by the exposed areas of the photo-resist P, are now etched. As is well known in photolithographic techniques, the reactivity and concentration of the wet etch chemicals as well as the length and temperature of the processing of the device determines the depth into the insulating layer AO of the etched areas. The wet etch chemicals typically used for this process comprise $H_3PO_4$, or $KOH$, or $NaOH$. As the wet etch chemicals etch the cavities defined by the photolithographic mask into the insulating layer AO, the enchant chemicals attack not only the bottom of the cavities but also the walls thereof. The barrier layer BL deposited on the surface of the insulating layer AO blocks the formation of a highly reactive interface on the aluminum oxide as was known in the prior art. Therefore, the etching solution substantially uniformly etches the exposed aluminum oxide surfaces absent the significant undercutting of the prior art wet etching processes.

As shown in FIG. 2, it is obvious that purely rectangular cavities are not formed in the aluminum oxide insulating layer AO due to the fact that the etching solution excavates the cavity in the aluminum oxide insulating layer AO and the lower regions of the cavity are exposed a much shorter time to the etching solution than the upper regions of the cavity. Therefore, the walls of the upper boundaries of the cavity are subject to etching by the etching solution for a greater period of time than the walls at the bottom of the cavity. This results in an unavoidable slope to the walls of the cavity but the slope of the walls is minimized by the use of the titanium or chromium barrier BL deposited on the insulating layer AO since the highly reactive region under the photo-resist P is prevented from forming by the use of the barrier layer BL. The wet etch process proceeds to completion as is well known in the art and the barrier layer BL deposited under the photo-resist P on the surface of the insulating layer AO is removed during or prior to the metalization processing of the chip.

What is claimed:

1. A method for wet etching an insulating layer formed on a substrate, comprising the steps of:

forming an insulating layer on a surface of a substrate;

depositing a barrier layer, comprising a substantially uniform layer of titanium, on said insulating layer which overlays said surface of said substrate;

depositing a photo-resist layer on said barrier layer;

photolithographically processing said photo-resist layer to selectively expose areas of said barrier layer for etching;

etching said exposed areas of said barrier layer to expose said insulating layer which lies below said exposed areas of said barrier layer; and wet etching said exposed areas of said insulating layer to remove a controllable amount of said insulating layer underlying said exposed areas of said barrier layer.

2. The method of claim 1 wherein said step of forming an insulating layer comprises:

forming a layer of aluminum oxide material on said surface of a substrate.

3. The method of claim 1 wherein said step of depositing a barrier layer comprises:

depositing a substantially uniform layer of titanium of thickness between 20–40 Å on said surface of said insulating layer.

4. A method for wet etching an insulating layer formed on a substrate, comprising the steps of:

forming an insulating layer on a surface of a substrate;

depositing a barrier layer, comprising a substantially uniform layer of chromium of thickness of approximately 1000 Å, on said insulating layer which overlays said surface of said substrate;

depositing a photo-resist layer on said barrier layer;

photolithographically processing said photo-resist layer to selectively expose areas of said barrier layer for etching;

etching said exposed areas of said barrier layer to expose said insulating layer which lies below said exposed areas of said barrier layer; and wet etching said exposed areas of said insulating layer to remove a controllable amount of said insulating layer underlying said exposed areas of said barrier layer.

5. The method of claim 1 wherein said step of depositing a barrier layer comprises:

depositing a substantially uniform layer of titanium of nominal thickness of 30 Å on said surface of said insulating layer.

6. A method for wet etching an insulating layer formed on a substrate, comprising the steps of:

forming an insulating layer on a surface of a substrate;

depositing a barrier layer, comprising a substantially uniform layer of titanium, on said insulating layer which overlays said surface of said substrate;

applying a layer of photo-resist on said barrier layer;

photolithographically processing said photo-resist layer to selectively expose areas of said barrier layer for etching;

etching said exposed areas of said barrier layer to expose said insulating layer which lies below said exposed areas of said barrier layer; and wet etching said exposed areas of said barrier layer to remove said barrier layer and a controllable amount of said insulating layer underlying said exposed areas of said barrier layer.

7. The method of claim 6 wherein said step of forming an insulating layer comprises:

forming a layer of aluminum oxide material on said surface of a substrate.

8. The method of claim 6 wherein said step of depositing a barrier layer comprises:

depositing a substantially uniform layer of titanium of thickness between 20–40 Å on said surface of said insulating layer.

9. The method of claim 6 wherein said step of depositing a barrier layer comprises:

depositing a substantially uniform layer of titanium of nominal thickness of 30 Å on said surface of said insulating layer.

* * * * *